(12) United States Patent
Kittur et al.

(10) Patent No.: US 11,696,420 B2
(45) Date of Patent: Jul. 4, 2023

(54) COOLING DEVICE FOR CIRCUIT BREAKERS USING PARASITIC MAGNETIC FIELDS BASED FORCED AIR FLOW GENERATOR

(71) Applicant: EATON INTELLIGENT POWER LIMITED, Dublin (IE)

(72) Inventors: Avadhoot Kittur, Pune (IN); T. R. Milind, Pune (IN); Mahesh Balakrishna Varrier, Kozhikode (IN); Robert Michael Slepian, Murrysville, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 42 days.

(21) Appl. No.: 17/370,369

(22) Filed: Jul. 8, 2021

(65) Prior Publication Data
US 2023/0012290 A1 Jan. 12, 2023

(51) Int. Cl.
*H05K 7/20* (2006.01)
*H02B 1/20* (2006.01)
*F04D 29/043* (2006.01)

(52) U.S. Cl.
CPC ....... *H05K 7/20172* (2013.01); *F04D 29/043* (2013.01); *H02B 1/20* (2013.01)

(58) Field of Classification Search
CPC ...... H05K 7/20172; F04D 29/043; H02B 1/20
(Continued)

(56) References Cited

U.S. PATENT DOCUMENTS

| 4,498,851 A * | 2/1985 | Kolm | F04D 33/00 310/331 |
| 4,834,619 A * | 5/1989 | Walton | F04D 33/00 417/410.2 |

(Continued)

FOREIGN PATENT DOCUMENTS

CN 108899235 A 11/2018

OTHER PUBLICATIONS

Zhang Yi, et al. "Chapter 5. Planar Linkages", Retrieved from the Internet: The Wayback Machine—https://web.archive.org/web/20071011015141/http://www.cs.cmu.edu:80/~rapidproto/mechanisms/chpt5.html, dated Sep. 9, 2022, pp. 1-7.

(Continued)

*Primary Examiner* — Anatoly Vortman
(74) *Attorney, Agent, or Firm* — Eckert Seamans Cherin & Mellott, LLC

(57) ABSTRACT

A cooling device for use with circuit interrupters includes a housing structured to be coupled to a terminal of the circuit interrupter and formed with several ventilation openings, as well as a permanent magnet, a torque converter and a fan blade all contained within the housing. When the cooling device is coupled to a terminal of a circuit interrupter and current flows through the terminals of the circuit interrupter, parasitic magnetic fields are generated and induce oscillatory motion of the permanent magnet. The torque converter is coupled to the permanent magnet and converts the oscillatory motion of the magnet to rotational motion that rotates the fan blade. The fan blade is disposed near the ventilation openings of the housing so that air flow produced by rotation of the fan blade travels across the surface of the circuit interrupter terminal nearest the ventilation openings to increase convection.

20 Claims, 4 Drawing Sheets

(58) Field of Classification Search
USPC .......................................................... 361/678
See application file for complete search history.

(56) References Cited

U.S. PATENT DOCUMENTS

| | | | | |
|---|---|---|---|---|
| 4,923,000 | A * | 5/1990 | Nelson | H01L 23/467 |
| | | | | 257/E23.098 |
| 5,522,712 | A * | 6/1996 | Winn | F04D 33/00 |
| | | | | 415/125 |
| 6,043,978 | A | 3/2000 | Mody et al. | |
| 6,194,798 | B1 * | 2/2001 | Lopatinsky | F04D 29/327 |
| | | | | 310/63 |
| 6,896,492 | B2 * | 5/2005 | Masterton | F04D 25/066 |
| | | | | 310/68 B |
| 7,402,932 | B2 * | 7/2008 | Applegate | H02K 21/14 |
| | | | | 310/112 |
| 9,011,113 | B2 * | 4/2015 | Ma | F04B 43/0054 |
| | | | | 417/410.2 |
| 9,702,357 | B2 * | 7/2017 | Tsai | H05K 7/20172 |
| 9,788,457 | B2 * | 10/2017 | Hessling von Heimendahl | |
| | | | | F04D 33/00 |
| 10,804,783 | B2 * | 10/2020 | Feng | F04D 19/002 |
| 2004/0042916 | A1 * | 3/2004 | Masterton | F04D 25/066 |
| | | | | 417/423.7 |
| 2010/0052324 | A1 | 3/2010 | Priya | |
| 2018/0082812 | A1 * | 3/2018 | Yang | H01F 38/14 |
| 2019/0165601 | A1 * | 5/2019 | Supriya | H01H 9/52 |
| 2020/0284249 | A1 * | 9/2020 | Nguyen | F04B 45/047 |
| 2022/0308644 | A1 * | 9/2022 | Kapinos | H02J 50/12 |

OTHER PUBLICATIONS

Yang Feng et al. "Magnetic and Electric Energy Harvesting Technologies in Power Grids: A Review", Sensors 2020, vol. 20, No. 5, Mar. 9, 2020 (Mar. 9, 2020), 12 pp.

European Patent Office "International Search Report and Written Opinion" from corresponding PCT Application No. PCT/EP2022/025319, dated Oct. 4, 2022, 15 pp.

* cited by examiner

COOLING DEVICE FOR CIRCUIT BREAKERS USING PARASITIC MAGNETIC FIELDS BASED FORCED AIR FLOW GENERATOR

BACKGROUND

Field

The disclosed concept relates generally to circuit interrupters, and specifically to systems and methods of regulating the temperature of circuit interrupters at critical locations.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open and close the separable contacts, and a trip mechanism, such as a trip unit, which senses a number of fault conditions to trip the breaker automatically. Upon sensing a fault condition, the trip unit actuates the operating mechanism into a trip state, which moves the separable contacts to their open position.

Fault conditions in circuit breakers are generally detected either by sensing the current flowing through the protected circuit or by sensing the temperature of conductors in the circuit breaker. Temperature based trips are generally caused by a sustained overcurrent condition in the protected circuit which causes the conductors in the protected circuit to increase in temperature. However, it can be difficult to precisely control the amount of time and the amount of current needed to initiate a temperature based trip, and because circuit breakers are required to pass stringent temperature tests prescribed by international standards, a premature temperature-based trip can lead to operational inefficiencies. International temperature standards specify the allowable temperature rise on the terminals of circuit breakers devices when they are carrying the rated currents. While safety is a critical consideration in the installation of electrical systems, maximizing efficiency within the confines of safety is desirable as well.

There is thus room for improvement in circuit interrupters, and methods of regulating the temperature at critical locations of circuit interrupters.

SUMMARY

In accordance with one aspect of the disclosed concept, a cooling device for reducing a temperature of a terminal connector of a busbar connected to a circuit interrupter terminal comprises: a number of support members structured to be mechanically coupled to the circuit interrupter terminal, a housing coupled to the support members, and a cooling assembly disposed within the housing. The cooling assembly comprises: a permanent magnet coupled to an interior of the housing, a torque converter coupled to the permanent magnet, and a fan blade coupled to the torque converter. The housing is formed with a plurality of ventilation openings on a side of the housing disposed to face the circuit interrupter terminal. The support members are produced to be of a length that disposes the permanent magnet in sufficient proximity to the circuit interrupter terminal such that, when current flows through the terminal of the circuit interrupter, a parasitic magnetic field generated by the flowing current exerts a force upon a magnetic field of the permanent magnet and thereby induces motion of the permanent magnet. The torque converter is structured to rotate the fan blade when motion is induced in the permanent magnet.

In accordance with another aspect of the disclosed concept, a circuit interrupter assembly comprises: a circuit interrupter structured to be disposed between a power source and an electrical load and comprising a plurality of terminals structured to be connected to a number of busbars, and a cooling device for reducing a temperature of a terminal connector of a busbar connected to the circuit interrupter. The cooling device comprises: a number of support members structured to be mechanically coupled to the circuit interrupter terminal, a housing coupled to the support members, and a cooling assembly disposed within the housing. The cooling assembly comprises: a permanent magnet coupled to an interior of the housing, a torque converter coupled to the permanent magnet. and a fan blade coupled to the torque converter. The housing is formed with a plurality of ventilation openings on a side of the housing disposed to face the circuit interrupter terminal. The support members are produced to be of a length that disposes the permanent magnet in sufficient proximity to the circuit interrupter terminal such that, when current flows through the terminal of the circuit interrupter, a parasitic magnetic field generated by the flowing current exerts a force upon a magnetic field of the permanent magnet and thereby induces motion of the permanent magnet. The torque converter is structured to rotate the fan blade when motion is induced in the permanent magnet.

In accordance with another aspect of the disclosed concept, a method of cooling a point of connection between a circuit interrupter terminal and a busbar comprises: disposing a permanent magnet in sufficient proximity to the point of connection such that a parasitic magnetic field produced by a flow of current through the circuit interrupter terminal exerts a force on a magnetic field of the permanent magnet, securing the permanent magnet in place with a pivot such that the permanent magnet can move about the pivot, coupling the permanent magnet to a torque converter structured to convert oscillatory motion to rotational motion, coupling a fan blade to the torque converter, and powering the circuit interrupter with AC power.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
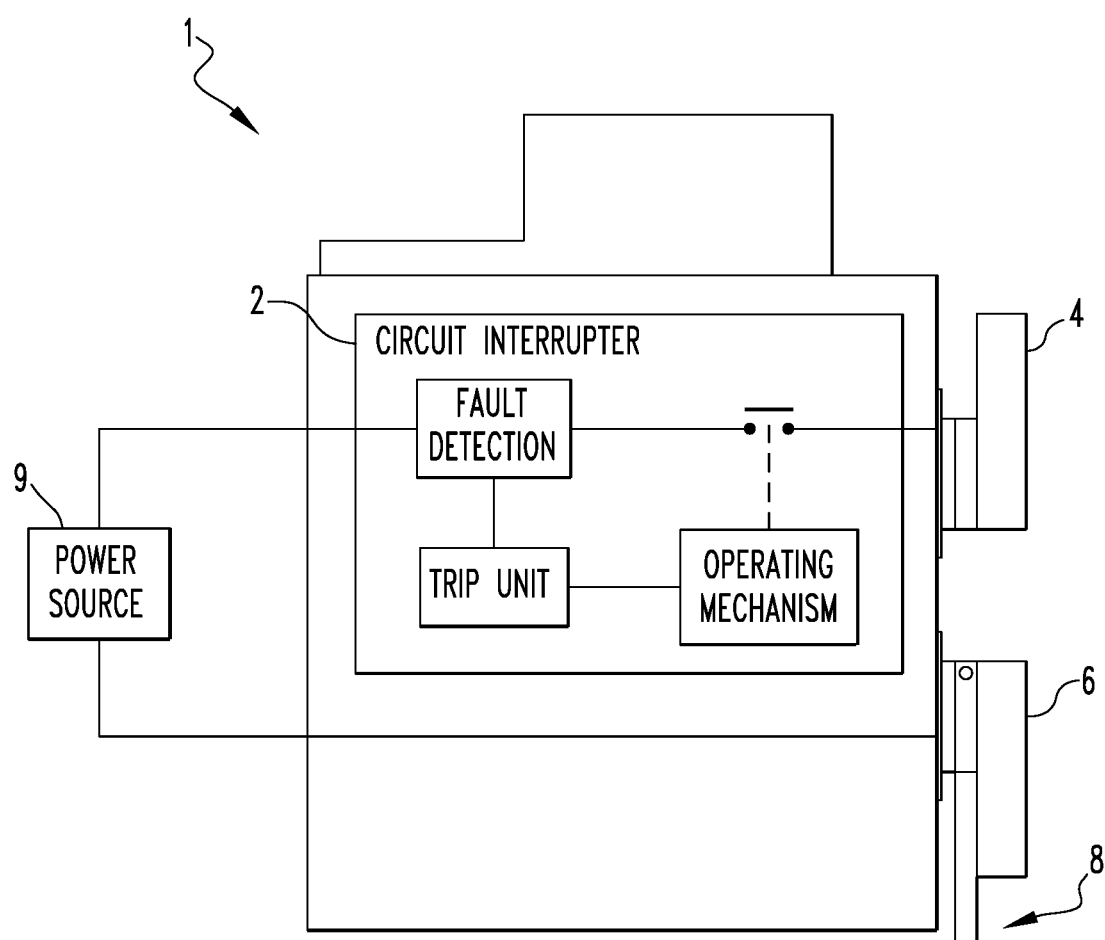
FIG. 1 is a simplified diagram of a circuit interrupter assembly comprising a cooling device in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "number" shall mean one or an integer greater than one (i.e., a plurality).

Figure 2:
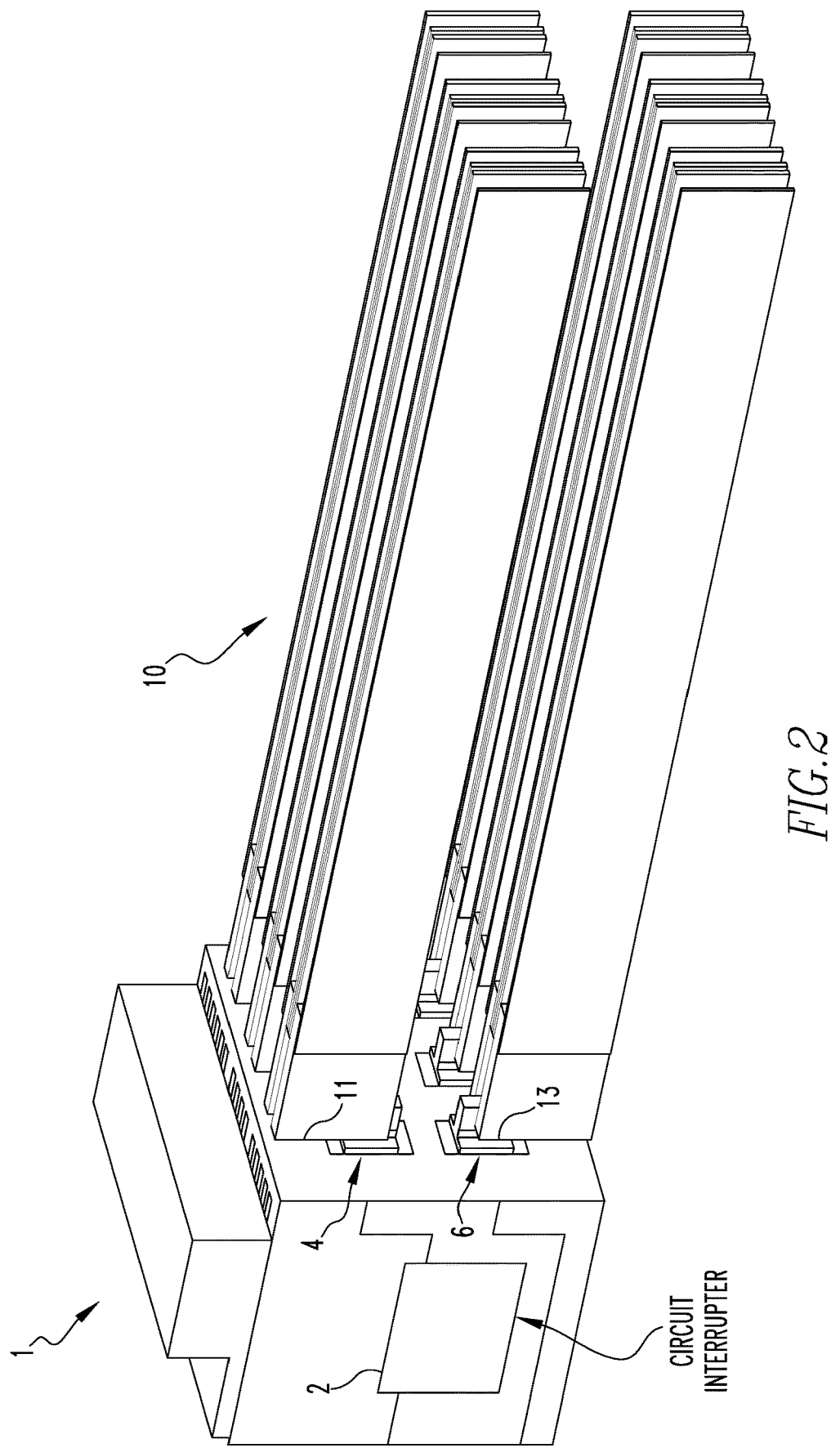
FIG. 2 is an isometric view of the circuit interrupter shown in FIG. 1 with a busbar connected to the terminals of the circuit interrupter.

FIG. 1 is a simplified diagram of a circuit interrupter assembly 1 including a circuit interrupter 2 with a pair of terminals 4, 6 structured to be connected to a busbar (as shown in FIG. 2) and a cooling device 8 in accordance with an example embodiment of the disclosed concept. The circuit interrupter 2 is structured to be electrically connected between a power source 9 providing AC power and a busbar via the terminals 4, 6. In one non-limiting example, terminal 4 can be connected to a hot conductor and terminal 6 can be connected to a neutral conductor of a busbar. For ease of reference, terminal 4 may be referred to hereinafter as "hot terminal 4" and terminal 6 may be referred to as "neutral terminal 6", however, the use of "hot" and "neutral" with respect to terminals 4 and 6 should not be construed as limiting on the type of conductor to which either terminal 4 or 6 can be connected. The cooling device 8 is coupled to the terminal 6 in order to cool components in the area proximate to the cooling device 8 when current is flowing through the circuit interrupter assembly 1, as described in more detail herein with respect to FIG. 5.

FIG. 2 shows a perspective view of the circuit interrupter 2 shown in FIG. 1 and a busbar 10 mechanically and electrically connected to one another. Busbar 10 comprises a first terminal connector 11 and a second terminal connector 13 which are coupled to terminal 4 and terminal 6, respectively, of the circuit interrupter 2. FIG. 2 depicts circuit interrupter 2 as a three-pole interrupter with three hot terminals 4 and three neutral terminals 6. It will be appreciated that the three-pole depiction is used for illustrative purposes only, and it should be noted that the cooling device 8 can be used with either a single pole or any multi-pole circuit interrupter without departing from the scope of the disclosed concept. It will be further appreciated that each pole of the pictured three-pole assembly functions equivalently in the present disclosure, and as such, the disclosed concept is described with respect to a single pole and its corresponding hot terminal 4 and neutral terminal 6, with the understanding that the description of the one pole is applicable to the other two poles as well.

Figure 3:
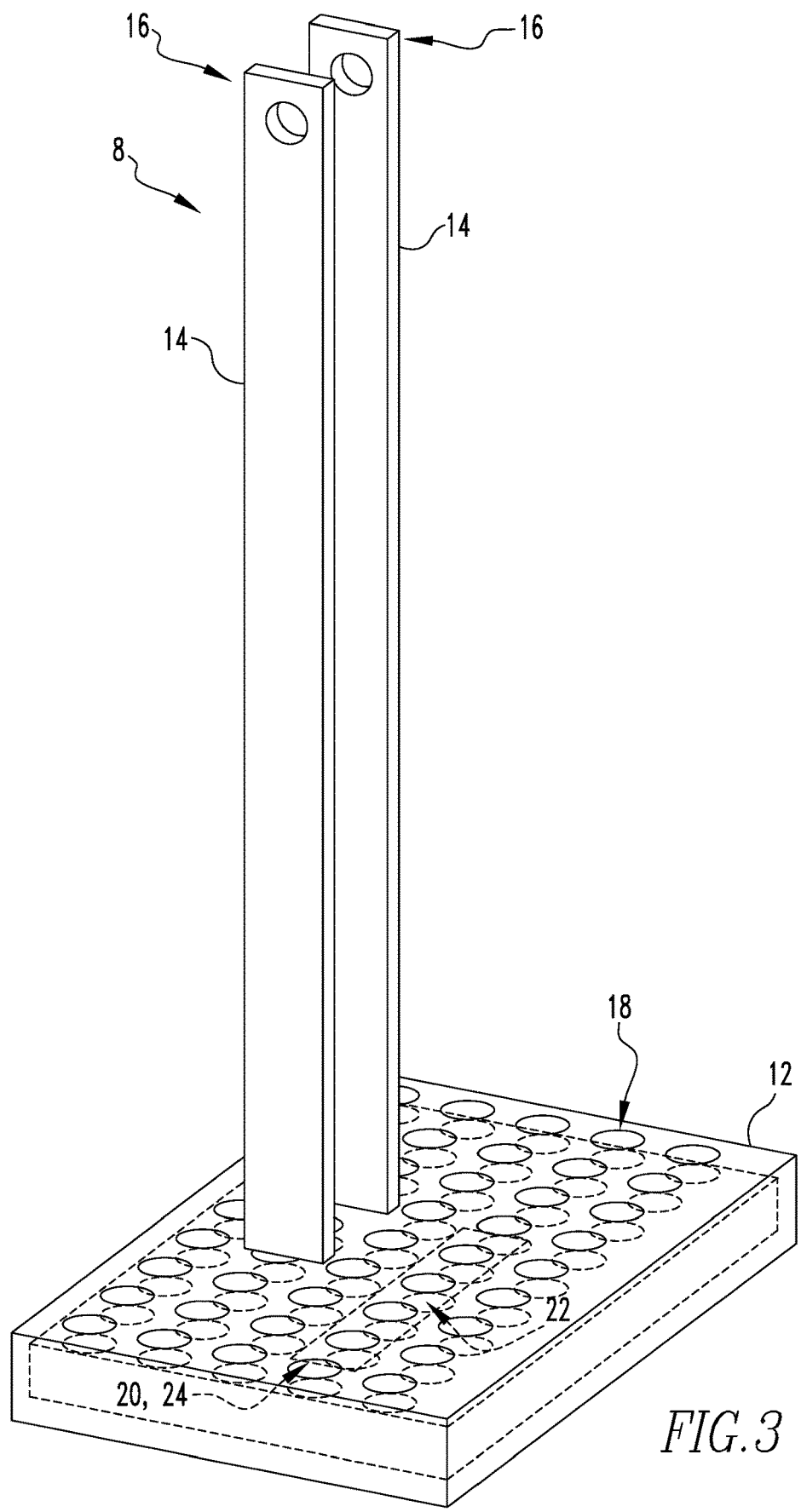
FIG. 3 is an isometric view of the cooling device shown in FIG. 1 in accordance with an example embodiment of the disclosed concept.
Figure 4A:
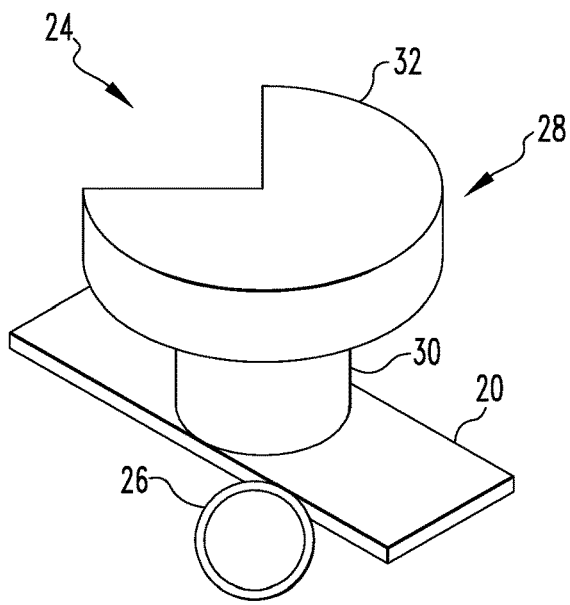
FIG. 4A is a partially simplified isometric view of a cooling assembly of the cooling device shown in FIG. 3 in accordance with an example embodiment of the disclosed concept.
Figure 4B:
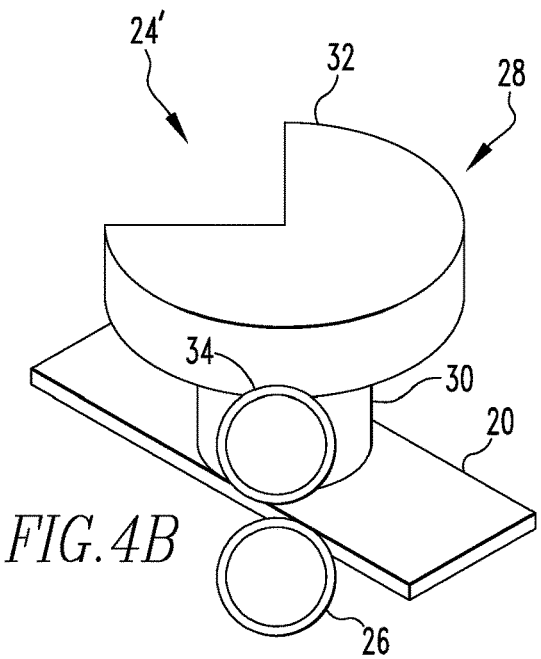
FIG. 4B is a partially simplified isometric view of an alternative cooling assembly of the cooling device shown in FIG. 3, comprising all of the elements of the cooling assembly shown in FIG. 4A and additionally comprising a variable inertia element in accordance with another example embodiment of the disclosed concept.

Referring now to FIG. 3, the cooling device 8 shown in FIG. 1 is depicted in more detail. Cooling device 8 comprises a housing 12 with a number of support members 14 coupled to the housing 12. Support members 14 can be either mechanically coupled to or integrally formed with housing 12 without departing from the scope of the disclosed concept. A bolt opening 16 is formed in each support member to facilitate coupling of the cooling device 8 to the circuit interrupter terminal 6 via a bolt or other comparable fastener. The top side (relative to the view shown in FIG. 3) of housing 12 is formed with a plurality of ventilation openings 18. Within housing 12, a permanent magnet 20 is coupled to the bottom side (relative to the view shown in FIG. 3) of the housing 12 via a pivot 22. While only a single magnet 20 is depicted, it should be noted that a number (i.e. one or more than one) of magnets 20 can be used in the cooling device 8 without departing from the scope of the disclosed concept. Pivot 22 can comprise, for example and without limitation, a pin, and enables magnet 20 to move about the pin in an oscillatory manner when external oscillatory magnetic forces act upon magnet 20, particularly when current flows through the terminals 4, 6 of the circuit interrupter 2, as described in more detail herein with respect to FIG. 5. Magnet 20 and pivot 22 are components of a greater cooling assembly 24 that is not shown in detail in FIG. 3 for the sake of pictorial clarity, but which is depicted in FIGS. 4A and 4B and is described in more detail herein with respect to those figures, as well as with respect to FIG. 5. In exemplary embodiments of the disclosed concept, housing 12 and support members 14 are produced from plastic or from other non-conductive materials coated with plastic.

Referring again to FIGS. 1 and 2 in conjunction with FIG. 3, it will be appreciated that there are two notable effects that result from current flowing through the terminals 4, 6 of the circuit interrupter to the busbar 10. First, magnetic fields are produced as a result of current flowing through a conductor. These magnetic fields that are produced due to current flow through the terminals 4, 6 are referred to hereinafter as "parasitic magnetic fields". Second, the flow of current causes the terminals 4, 6 and any proximate components to heat up due to resistance of the conductors, particularly if heavy loads drawing high magnitude current are connected to the busbar 10.

Figure 5:
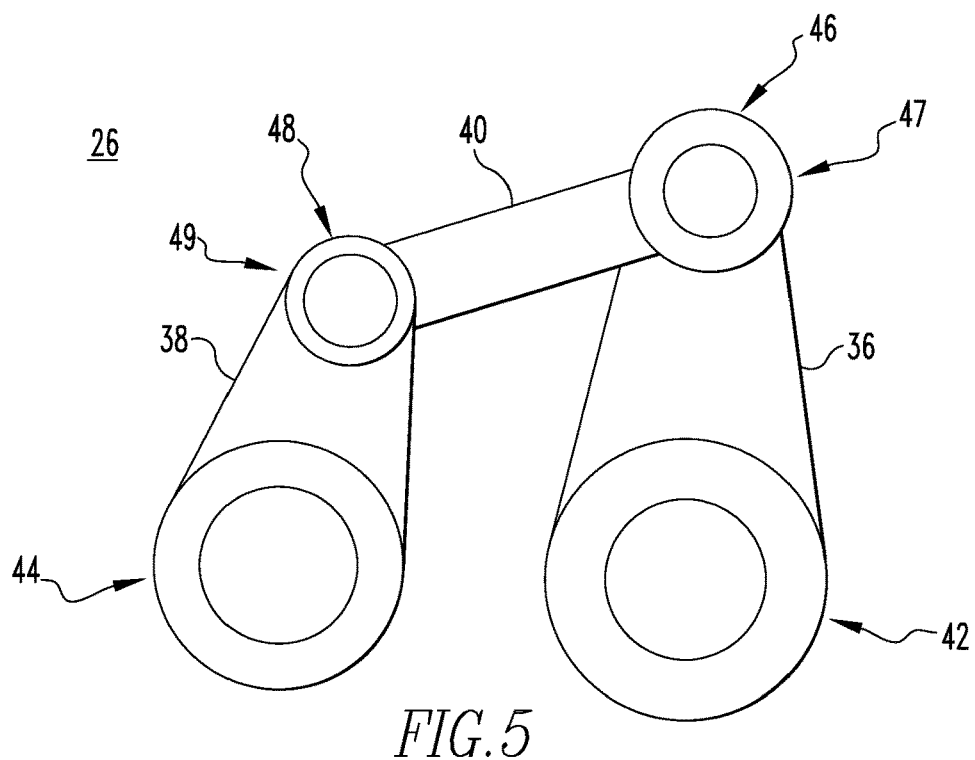
FIG. 5 is a depiction of a torque converter used in the cooling assemblies shown in FIGS. 4A and 4B in accordance with an example embodiment of the disclosed concept.

The cooling device 8 harnesses the properties of the parasitic magnetic fields to power a fan, as detailed herein with respect to FIGS. 4A, 4B, and 5. Because the power source 9 provides AC power, the parasitic magnetic fields around the terminals 4, 6 change in magnitude and orientation in accordance with the frequency of the supplied power. Due to the proximity of magnet 20 to terminal 6, the parasitic magnetic field local to terminal 6 interacts with the magnetic field of magnet 20, inducing oscillatory motion of magnet 20 corresponding to the oscillatory nature of the parasitic magnetic field around terminal 6.

Referring now to FIG. 4A, a simplified depiction of a first exemplary embodiment of the cooling assembly 24 denoted in FIG. 3 is shown. FIG. 4B shows a simplified depiction of a second exemplary embodiment cooling assembly 24'. The cooling assembly 24 shown in FIG. 4A comprises magnet 20, a schematically depicted torque converter 26, and a fan 28, the fan 28 comprising a shaft 30 and a blade 32. The cooling assembly 24' shown in FIG. 4B comprises the same components as cooling assembly 24 and additionally comprises a variable inertia component 34 coupled to the fan shaft 30. Unless otherwise indicated, wherever reference is made to the cooling assembly 24 herein, it will be appreciated that the reference is applicable to cooling assembly 24' as well.

Referring to FIG. 3 in conjunction with FIGS. 4A and 4B, it should be noted that in an exemplary embodiment of the disclosed concept, the cooling assembly 24 is to be oriented within the housing 12 such that the magnet 20 is disposed nearest to the bottom side of housing 12 and the fan blade 32 is disposed nearest to the top side of housing 12 so as to be in close proximity to the ventilation openings 18 ("bottom" and "top" being relative to the view shown in FIG. 3). The torque converter 26 is shown schematically within the cooling assemblies 24, 24' in FIGS. 4A and 4B in order to denote its presence in the cooling assemblies 24, 24', but the actual structure of the torque converter 26 is shown in FIG. 5. Furthermore, it should be noted that the torque converter 26 is actually disposed within the interior of the fan shaft 30 rather than externally to the shaft 30, as explained herein with respect to FIG. 5.

Referring now to FIG. 5, the torque converter 26 is shown in more detail. The torque converter 26 comprises an oscillatory link 36, a rotating link 38, and a coupling link 40. A first end 42 of the oscillatory link 36 is to be coupled via a first coupling to the magnet 20 and coupled via a second coupling to the housing 12. In particular, the first end 42 of the oscillatory link 36 comprises an oscillatory pivot (not separately numbered from the first end 42) that is to be coupled to the housing 12, so as to enable the oscillatory link 36 to rotate about the oscillatory link pivot 42 with respect to the housing 12. A first end 44 of the rotating link 38 also is to be coupled to the housing 12 via a first coupling, and is to be rigidly coupled to the fan blade 32 via a second coupling. In one non-limiting example, a number of pins can be used to couple the oscillatory link 36 to each of the magnet 20 and the housing 12, and to couple the rotating link 38 to each of the fan blade 32 and the housing 12. However, any fasteners suitable for coupling the oscillatory link 36 to the magnet 20 and the housing 12 and for coupling the rotating link 38 to the fan blade 32 and the housing 12 can be used without departing from the scope of the disclosed concept.

A second end 46 of the oscillatory link 36 disposed opposite the first end 42 is coupled to the coupling link 40 via a pin joint 47, and a second end 48 of the rotating link 38 disposed opposite the first end 44 is coupled to the coupling link 40 via another pin joint 49. Accordingly, because the oscillatory link 36 is coupled to the magnet 20, any motion of the magnet 20 induced by the oscillating parasitic magnetic fields around the terminal connector 13 of the busbar 10 is transmitted to the rotating link 38 from the oscillatory link 36 via the coupling link 40. The transmission of the motion to the rotating link 38 causes the rotating link 38 to rotate and thus drives the fan blade 32 to rotate. In some exemplary embodiments, a vibration resonant amplifier (not shown) can be coupled to the oscillatory link 36 in order to amplify the oscillatory motion of the magnet 20 and consequently amplify the oscillatory motion of oscillatory link 36, the rotational motion of the rotating link 38, and the rotating speed of the fan blade 32.

Referring again to FIGS. 3, 4A, and 4B in conjunction with FIG. 5, it will be appreciated that rotation of fan blades 32 creates air flow that exits the housing 12 via the ventilation openings 18 and travels toward the busbar 10. In addition, it will be appreciated that coupling of the variable inertia component 34 to the fan blade 32 in cooling assembly 24' (FIG. 4B) provides the ability to adjust the rotational speed of the fan blade 32 in a more incremental fashion. Furthermore, it will be appreciated that the cooling device 8 is configured such that the top side of the housing 12 including the ventilation openings lies in a plane disposed orthogonal to those planes in which the majority of the surface area of the terminal connector 13 lies in order to maximize convection of heat away from the terminal connector 13.

Referring now to FIGS. 1 and 2, it should be noted that the terminal connectors 13 of the busbar 10 that are directly coupled to the terminals 6 of the circuit interrupter are disposed directly in the path of the air flow created by the torque converter 26 after exiting the housing 12 through the ventilation openings 18. For economy of disclosure, the cooling device 8 is only depicted and described as being affixed to terminal 6 of the circuit interrupter 2 so as to cool the terminal connector 13 of the busbar 10, however, it will be appreciated that the cooling device 8 can instead be coupled to the terminal connector 11 of the busbar 10 such that the housing 12 of the cooling device is disposed above (relative to the views shown in FIGS. 1-2) the terminal connector 11, with the ventilation openings 18 facing the terminal connector 11, or the cooling device 8 could be coupled to either of terminal connector 11 or 13 such that the cooling device 8 is disposed between terminal connector 11 or 13, without departing from the scope of the disclosed concept.

The magnitude of the torque output by the torque converter 26, the magnitude of the airflow produced by the fan blade 32, and the magnitude of the heat transfer coefficient resulting from the airflow produced by fan blade 32 all depend on the frequency of the current provided by the power source 9, the dimensions of the permanent magnet 20, and the dimensions of the fan blade 32, among other factors. For example and without limitation, a cooling device 8 produced for use with a circuit interrupter 2 that is powered by 50 Hz utility power will be designed with slightly different parameters than a cooling device 8 produced for use with a circuit interrupter 2 that is powered by 60 Hz utility power. However, it will be appreciated that adjusting the parameters of the cooling device 8 to best suit the cooling needs of a given circuit interrupter 2 is straightforward using known principles of electromagnetism, mechanics, air flow, and heat transfer.

In laboratory experiments wherein the circuit interrupter was powered by a 50 Hz power source, the cooling device 8 was observed to reduce the temperature of the terminal connector 13 by 7° C. and the heat transfer coefficient was determined to increase to about 20 W/m²K from a natural convection value of about 7 W/m²K. In said laboratory experiments, the heat transfer coefficient $h_{cW}$ was calculated using the following correlation valid for flow over a flat plate, the flat plate being the terminal connector 13 (or alternatively, the terminal connector 11) of the busbar 10:

$$h_{cW} = 12.12 - 1.16v + 11.6v^{1/2}$$

wherein flow rate was calculated to be 0.1 m³/s (flow being the air flow generated by the fan 28), v was velocity calculated from the flow rate, and air velocity outside the fan 28 was calculated to be 12.5 m/s.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A cooling device for reducing a temperature of a terminal connector of a busbar connected to a circuit interrupter terminal, the cooling device comprising:
   a number of support members structured to be mechanically coupled to the circuit interrupter terminal;
   a housing coupled to the support members; and
   a cooling assembly disposed within the housing, the cooling assembly comprising:
      a permanent magnet coupled to an interior of the housing;
      a torque converter coupled to the permanent magnet; and
      a fan blade coupled to the torque converter,
   wherein the housing is formed with a plurality of ventilation openings on a side of the housing disposed to face the circuit interrupter terminal,
   wherein the support members are produced to be of a length that disposes the permanent magnet in sufficient proximity to the circuit interrupter terminal such that, when current flows through the terminal of the circuit interrupter, a parasitic magnetic field generated by the flowing current exerts a force upon a magnetic field of the permanent magnet and thereby induces motion of the permanent magnet, and
   wherein the torque converter rotates the fan blade when motion is induced in the permanent magnet.

2. The cooling device of claim 1, wherein the number of support members and the housing are produced from a non-conductive material.

3. The cooling device of claim 1, wherein the torque converter comprises:
   an oscillatory link;
   a coupling link; and
   a rotating link,
   wherein the oscillatory link is coupled to the permanent magnet and to the coupling link,
   wherein the coupling link couples the oscillatory link to the rotating link,
   wherein the rotating link is coupled to the fan blade.

4. The cooling device of claim 3, wherein the oscillatory link and the rotating link are each coupled to the housing.

5. The cooling device of claim 1,
   wherein the cooling assembly further comprises a fan shaft disposed between the fan blade and the permanent magnet, and
   wherein the torque converter is disposed within the fan shaft.

6. The cooling device of claim 5, wherein the cooling assembly further comprises a variable inertia element coupled to the fan shaft.

7. The cooling device of claim 1, wherein the support members and the housing are configured such that the side of the housing formed with the plurality of ventilation openings is disposed in a plane orthogonal to those planes in which a majority of a surface area of the terminal connector lies.

8. A circuit interrupter assembly, the circuit interrupter assembly comprising:
   a circuit interrupter structured to be disposed between a power source and an electrical load, the circuit interrupter comprising a terminal structured to be connected to a busbar; and
   a cooling device for reducing a temperature of a terminal connector of the busbar, the cooling device comprising:
      a number of support members mechanically coupled to the circuit interrupter terminal;
      a housing coupled to the support members; and
      a cooling assembly disposed within the housing, the cooling assembly comprising:
         a permanent magnet coupled to an interior of the housing;
         a torque converter coupled to the permanent magnet; and
         a fan blade coupled to the torque converter,
      wherein the housing is formed with a plurality of ventilation openings on a side disposed to face the circuit interrupter terminal,
      wherein the support members are produced to be of a length that disposes the permanent magnet in sufficient proximity to the circuit interrupter terminal such that, when current flows through the circuit interrupter terminal, a parasitic magnetic field generated by the flowing current exerts a force upon a magnetic field of the permanent magnet and thereby induces motion of the permanent magnet, and
      wherein the torque converter rotates the fan blade when motion is induced in the permanent magnet.

9. The circuit interrupter of claim 8, wherein the number of support members and the housing are produced from a non-conductive material.

10. The circuit interrupter of claim 8, wherein the torque converter comprises:
    an oscillatory link;
    a coupling link; and
    a rotating link,
    wherein the oscillatory link is coupled to the permanent magnet and to the coupling link,
    wherein the coupling link couples the oscillatory link to the rotating link,
    wherein the rotating link is coupled to the fan blade.

11. The circuit interrupter of claim 10, wherein the oscillatory link and the rotating link are each coupled to the housing.

12. The circuit interrupter of claim 8,
    wherein the cooling assembly further comprises a fan shaft disposed between the fan blade and the permanent magnet, and
    wherein the torque converter is disposed within the fan shaft.

13. The circuit interrupter of claim 12, wherein the cooling assembly further comprises a variable inertia element coupled to the fan shaft.

14. The circuit interrupter of claim 8, wherein the support members and the housing are configured such that the side of the housing formed with the plurality of ventilation openings is disposed in a plane orthogonal to those planes in which a majority of a surface area of the terminal connector lies.

15. A method of cooling a point of connection between a circuit interrupter terminal and a busbar, the method comprising:
    disposing a permanent magnet in sufficient proximity to the point of connection such that a parasitic magnetic field produced by a flow of current through the circuit interrupter terminal exerts a force on a magnetic field of the permanent magnet and securing the permanent magnet in place with a pivot such that the permanent magnet can move about the pivot;

coupling the magnet to a torque converter that converts oscillatory motion to rotational motion;
coupling a fan blade to the torque converter; and
powering the circuit interrupter with AC power.

16. The method of claim 15, further comprising:
housing the permanent magnet, the torque converter, and the fan blade in a non-conductive housing with ventilation openings formed in a side of the housing nearest to the fan blade;
coupling the housing to a number of non-conductive support members; and
coupling the support members to the circuit interrupter terminal such that the side of the housing nearest to the fan blade faces the circuit interrupter terminal.

17. The method of claim 15, further comprising:
coupling an oscillatory link, a coupling link, and a rotating link to one another to form the torque converter such that the coupling link couples the rotating link to the oscillatory link in a manner that enables the rotating link to translate oscillatory motion of the oscillatory link into rotational motion;
coupling the oscillatory link to the permanent magnet; and
coupling the rotating link to the fan blade.

18. The method of claim 17, further comprising:
coupling the oscillatory link and the rotating link to the housing.

19. The method of claim 15, further comprising:
disposing a fan shaft between the fan blade and the permanent magnet,
and
disposing the torque converter within the fan shaft.

20. The method of claim 19, further comprising:
coupling a variable inertia element to the fan shaft.

* * * * *